United States Patent [19]

Metzger et al.

[11] Patent Number: 5,372,910
[45] Date of Patent: Dec. 13, 1994

[54] IMAGE TRANSFER LAYERS

[75] Inventors: Bernhard Metzger, Darmstadt; Helmet H. Fröhlich, Heusenstamm, both of Germany

[73] Assignee: E. I. Du Pont de Nemours and Company, Wilmington, Del.

[21] Appl. No.: 147,243

[22] Filed: Nov. 3, 1993

Related U.S. Application Data

[60] Division of Ser. No. 981,904, Nov. 23, 1992, Pat. No. 5,292,622, which is a continuation of Ser. No. 620,892, Dec. 3, 1990, abandoned.

[30] Foreign Application Priority Data

Dec. 15, 1989 [DE] Germany ............... 3941493

[51] Int. Cl.$^5$ .............................. G03C 8/00
[52] U.S. Cl. .................. 430/202; 430/252; 430/253; 430/271; 430/292; 430/293
[58] Field of Search ............... 430/202, 252, 253, 231, 430/292, 293

[56] References Cited

U.S. PATENT DOCUMENTS

| | | | |
|---|---|---|---|
| 3,020,726 | 11/1971 | Chu et al. | 96/27 R |
| 3,582,327 | 6/1971 | Boyd et al. | 96/28 |
| 3,649,268 | 3/1972 | Chu et al. | 96/27 R |
| 4,215,193 | 7/1980 | Manger et al. | 430/291 |
| 4,243,741 | 1/1981 | Abele et al. | 430/270 |
| 4,346,162 | 8/1982 | Abele | 430/270 |
| 4,356,253 | 10/1982 | Buzzell | 430/291 |
| 4,497,917 | 2/1985 | Upson et al. | 523/201 |
| 4,604,340 | 8/1986 | Grossa | 430/270 |
| 4,726,877 | 2/1988 | Fryd et al. | 156/630 |
| 4,753,865 | 6/1988 | Fryd et al. | 430/281 |
| 4,806,451 | 2/1989 | Frohlich | 430/291 |
| 4,892,802 | 1/1990 | Bauer et al. | 430/270 |
| 4,902,363 | 2/1990 | Delaney et al. | 156/230 |
| 4,935,331 | 6/1990 | Platzer et al. | 430/254 |
| 4,939,029 | 7/1990 | Delaney et al. | 428/314.4 |
| 4,948,704 | 8/1990 | Bauer et al. | 430/291 |

Primary Examiner—Jack P. Brammer

[57] ABSTRACT

A process for preparing images on a tonable, light-sensitive layer using a transfer layer containing at least 20 percent by weight of a toner and a polymer with a maximum tensile strength of at least 2 N/mm$^2$ as a binder. The pigmented transfer layers can be used in color proofing processes requiring high resolution, reproducible color density and low dot gain.

1 Claim, No Drawings

IMAGE TRANSFER LAYERS

This is a division of application Ser. No. 07/981,904, filed Nov. 23, 1992 now U.S. Pat. No. 5,292,622, which is a continuation of application Ser. No. 07/620,892, filed Dec. 3, 1990, now abandoned.

FIELD OF THE INVENTION

This invention relates to a process for preparing images on tonable, light-sensitive layers and, in particular, to a color proofing process which uses a light-insensitive transfer layer having (i) at least one polymer with a maximum tensile strength of at least 2 N/mm$^2$, and (ii) at least 20 percent by weight of a toner.

BACKGROUND OF THE INVENTION

The reprographic industry uses light-sensitive recording materials wherein differences in the tackiness of the exposed and unexposed areas are utilized for image production. For example, German Patents 12 10 321, 19 04 058, 19 04 059 and 20 04 214, disclose a reproduction process in which a tacky photopolymerizable recording material, consisting of a support and a photopolymerizable layer containing at least one addition-polymerizable monomer and a photopolymerization initiator, is hardened by imagewise exposure, whereby the exposed image areas lose their tackiness. The latent image is then visualized by applying a suitable toner, which adheres only to the unexposed tacky areas. Excess toner remaining on the exposed, non-tacky image areas is removed. This process produces positive, and optionally colored, images of the original, and these images resemble in appearance images produced by the use of printing inks. Thus, the process has achieved considerable practical importance, particularly in the printing industry for proofing color separations.

German Patent 29 49 462 discloses pigmented layers containing 75 to 95 parts by weight pigment and 5 to 25 parts by weight of an elastomeric binder with a maximum tensile strength of less than 1.38 N/mm$^2$ and an elongation at break of at least 50%. The process produces high opacity images that are used preferably for the reproduction of text and display pieces. However, due to the high opacity, the process is not suitable for color proofing processes. A reduction of pigment content does lead to a lower density, but it also causes a complete loss of resolution.

German Patent 12 85 876 describes photopolymerizable recording materials for thermal image transfer. Between the photopolymerizable layer and the support sheet, these recording materials have a layer of a thermoplastic polymer, such as, for example, polyethylene or ethylene/vinyl acetate copolymers combined with a wax, and optionally containing a pigment. The unexposed areas of the photopolymerizable layer with adhering portions of the intermediate layer can be transferred thermally. The portions of the intermediate layer corresponding to the unexposed areas adhere only partially to the photopolymerizable layer in this transfer, and the portions remaining on the support can be used for additional transfers. After multiple transfers, a transparent negative remains on the support. Only a portion of the intermediate layer is transferred each time, therefore, variations in the color density of the transferred areas are unavoidable.

Halftone color separations are used in reprography as copy originals for the preparation of offset or relief printing plates. The color separations are checked, prior to exposing the plates, with the aid of color proofing processes to determine whether the ultimate printing result will represent a tonally correct reproduction of the original. General standard specifications indicate that a resolution of 2%–98% dots at a screen spacing of 60 lines/cm is required for high quality offset printing. However, it is particularly difficult to achieve satisfactory resolution of pointy 2% dots in the highlights and of 98% dots in the shadows. It is also of considerable importance for halftone dots of the same size to be sharply defined and uniform over the entire surface, if good tonal value reproduction is to be achieved.

With the advancing technical development of printing machines that can now achieve a resolution of 1% to 99% dots, requirements for the proofing processes also become more stringent. Modern printing machines also achieve even smaller dot gain, which the proofing process must reflect.

Thus, the transfer layer such as the one described in German Patent 36 25 014, which uses a special binder system of incompatible polymers, cannot achieve the lower dot gain obtained by modern printing machines even though a resolution of 2% to 98% dots can be attained. In addition, the process for preparing the transfer materials described in German Patent 36 25 014 has several disadvantages. It is (1) time consuming and costly; (2) a controllable layer structure is quite difficult to achieve; (3) the pigments must be milled separately, (4) the production formulations must be processed immediately, and (5) the dispersions must be intensively mixed during the entire preparation process to prevent the components from settling and clumping. Only then can a uniform coating on the support be assured. The coating rate must also be low, a further disadvantage in the production process.

Accordingly, the object of the present invention is to provide a process for preparing images on tonable, light-sensitive layers by using a transfer layer containing at least one toner. A further object is to provide a process that achieves a high resolution of 1% to 99% dots as required by the printing industry. In addition, this process should provide highly uniform halftone values over the entire surface and very low dot gain, thus avoiding the previously described disadvantages and deficiencies. The process should also be useful for various tonable, light sensitive layers.

SUMMARY OF THE INVENTION

The invention relates to a process for preparing images on light-sensitive layers which comprises:
   (a) exposing imagewise a light-sensitive layer so that tacky and non-tacky areas are produced;
   (b) contacting the exposed layer with a light insensitive transfer layer on a support, the transfer layer having (i) at least one polymer with a maximum tensile strength of at least 2 N/mm$^2$, and (ii) at least 20 percent by weight of a toner; and
   (c) separating the exposed layer from the transfer layer.

In another embodiment, the process of the invention can be used to prepare multi-color images.

DETAILED DESCRIPTION OF THE INVENTION

The process of the invention utilizes a transfer layer containing at least 20 percent by weight of a toner and at least one polymer with a maximum tensile strength of at least 2 N/mm² used as the binder. The term toner as used herein means at least one finely divided powder or a combination of a finely divided powder and at least one dissolved dye.

These transfer layers have not been used heretofore in color proofing processes requiring high resolution, reproducible color density, and low dot gain. In fact, the binders used to formulate the transfer layers described herein would not be suitable for the process taught by German Patent 29 49 462 because the minimum requirements set forth by the patent would not be met. See, for example, Examples 6 and 11 of German Patent 29 49 462. Surprisingly and unexpectedly, it has been found that the stringent requirements of a color proofing process can be met using, in the process of the invention, a transfer layer having (i) at least one polymer with a maximum tensile strength of at least 2 N/mm² and (ii) at least 20 percent by weight of a toner.

In contrast to conventional transfer layers, the transfer layer used in the process of the invention can be made in a simple, rapid and cost-effective manner. Furthermore, the transfer layer can be combined with many tonable, light-sensitive elements such as the positive, light-sensitive elements described in U.S. Pat. No. 4,356,253 which are preferred. Particularly good results are obtained with the materials described in European Patent Application 02 43 933. The polymers used as binders to make the transfer layer should have a maximum tensile strength of at least 2 N/mm², and preferably between 2 and 110 N/mm². Polymers having a maximum tensile strength between 5 and 60 N/mm² are especially suitable.

Polymers which can be used as binders include homopolymers and copolymers of ethylene, propylene, vinyl esters, vinyl chloride, acrylates, methacrylates, and acrylamides or methacrylamides, and cellulose derivatives. Polymers soluble in organic solvents are especially preferred. In particular, copolymers of vinyl acetate and ethylene and polymethyl methacrylate or polystyrene are very suitable. If desired, polymer mixtures can also be used.

The transfer layer should contain at least 20 percent by weight, and preferably 30 to 70 percent by weight of a toner. A particularly preferred embodiment of the transfer layer contains the binder and toner in approximately equal quantities.

Toners acceptable for image recording are well known in the art. For example, see German Patents 19 04 059 and 29 46 896. These toners are finely divided powders such as pigments, but dissolved dyes are also useful in combination with a finely divided powder. Examples of finely divided powders include inorganic and organic pigments, fluorescent materials, pure metal powders or combined with a powdered organic or inorganic carrier, such as titanium dioxide, glass powder, carbon (lampblack or graphite), metal phthalocyanines, azo dyes, metal powders of aluminum, copper, iron, gold, or silver, or metal oxides. The use of a mixture of pigment and $SiO_2$ is particularly advantageous. The preparation of the layer formulations is accomplished by methods well-known in the art.

The application of toners, consisting mostly of finely divided powders, can be accomplished by dusting the imagewise exposed surface with the toner. The toner can also be loosely bonded to a separate carrier and transferred by bringing the carrier into contact with the imagewise exposed layer. Thus, for example, German Patent 12 05 117 discloses the use of layers, consisting of toner material and optionally, a binder, coated on a support for thermal transfer processes.

For the preparation of the transfer layer, the layer is coated by known methods onto a support and then dried. Pigment/binder mixtures in organic solvents are preferred for coating on the support. Suitable supports include paper and synthetic resin films of polyesters, polyamides, polyethylene, polypropylene, polyvinyl chloride and the like. Compressible materials, such as those described in German Patent OS 37 065 28 are especially advantageous.

The thickness of the dried layer can be up to 8 μm, and preferably up to 5 μm. However, it is also possible in the present invention to prepare very thin layers with a thickness of less than 3 μm, preferably 0.4–1.5 μm. Such layers are especially desirable for color proofing processes requiring very high resolution and very low dot gain. In particular, 1 μm thick layers on polypropylene foam sheets, in accordance with German OS 37 06 528 are quite acceptable for these purposes. The transfer layer can also contain other additives, such as surfactants, casting aids, slip agents, agents to increase viscosity, agents for adhesion control and the like.

The present process is acceptable for image production on most light-sensitive layers that can be modified into tacky and non-tacky areas by imagewise exposure. The light-sensitive layer can consist of positive as well as negative tonable systems. Suitable positive tonable systems are photohardenable, primarily, photopolymerizable systems like those described in German Patents 12 10 321, 19 04 058, 19 04 059 and 20 04 214. The essential components of these photopolymerizable systems are one or more addition-polymerizable monomers, a binder or mixture of binders, and a photoinitiator or initiator system. The materials described in European Patent Application 02 43 933 are especially desirable. Negative tonable systems are similarly known and described, for example, in German Patents 27 58 209, 30 23 247 and 34 29 615. The light-sensitive components of these systems are either a light-sensitive dihydropyridine compound or a light-sensitive system consisting of a dihydropyridine compound and a hexaaryl bisimidazole compound.

The light-sensitive materials are most sensitive to the ultraviolet region, preferably to wavelengths between 250 and 450 nm. Therefore, radiation sources that emit an effective quantity of this radiation are suitable for practicing the invention. Suitable radiation sources include xenon lamps, mercury vapor lamps, and carbon arc lamps, lasers, fluorescent lamps with phosphors emitting UV radiation, and electronic flash devices.

The process of the invention can be used for the reproduction of line and halftone photographs for use in graphic and other industry areas to make maps, printed advertisements, posters, luminous texts and to make printed circuits. However, a principal field of use is in the preparation of single or multi-color images and in utilization for color proofing processes.

In accordance with the present invention, there is provided a color proofing process for preparing images on light-sensitive layers comprising:
  (a) exposing imagewise a light-sensitive layer so that tacky and non-tacky areas are produced;
  (b) contacting the exposed layer with a light insensitive transfer layer on a support, the transfer layer
    (i) having at least one polymer with a maximum tensile strength of at least 2 N/mm², and (ii) at least 20 percent by weight of a toner; and (c) separating the exposed layer from the transfer layer.

A light-sensitive element comprising a photopolymerizable layer on a support and a cover sheet is placed onto an image receptor. The cover sheet is removed and the element is exposed with actinic radiation through the transparent support, using as an original a halftone color separation positive or negative, depending on whether it is a positive or negative working system, of a first color to form tacky and non-tacky areas. The transfer layer is laminated onto the exposed layer and following lamination, the transfer layer is peeled off. A color image of the original is obtained.

In accordance with the instant invention, there is also provided a process for preparing multi-color images on tonable light sensitive layers which comprises:
 (a) applying a light-sensitive layer in which tacky and non-tacky areas can be produced by imagewise exposure onto a support;
 (b) exposing imagewise the light-sensitive layer;
 (c) contacting the exposed layer with a light-insensitive transfer layer on a support, the transfer layer (i) having at least one polymer with a maximum tensile strength of at least 2 N/nun$^2$ and (ii) at least 20 percent by weight of a toner;
 (d) removing the support containing the non-adhering areas of the transfer layer;
 (e) applying a new light-sensitive layer onto the existing image; and
 (f) repeating steps (b) through (e) at least twice.

Thus, a second light-sensitive element is laminated, after removal of the cover sheet, onto the image, and exposed under similar conditions through a halftone color separation negative or positive of a second color as the original and is toned by laminating on and then peeling off the transfer layer. This process is then repeated with a color separation of a third color and if desired, with a black separation. A four color image corresponding to the original is obtained.

The invention is especially advantageous in that, if a positive working light-sensitive system is used, four-color overlay and a positive color proof therefrom can also be prepared from negative color separations as originals.

If negative color separations are the starting point, a proof is prepared first by the above process. The images remaining on the transfer layers used to transfer the separate colors are then laminated one over another by the use of adhesive intermediate layers and with the application of pressure and/or heat for the preparation of a proof. The support is subsequently peeled off. In another embodiment, it is also possible to place the images remaining on the transfer layers one over another to produce an overlay proof.

In contrast to the transfer layers disclosed in German Patent 36 25 014, the transfer layers used in the process of the invention are less time-consuming, more cost-effective and can be prepared with constant quality. In addition, a more uniform coating and a color layer with fewer thickness variations are obtained. Consequently, flawless transfer and high resolution are achieved with low dot gain. Also, pigmented transfer layers having a controllable structure are obtained by using the polymers of the invention.

The following examples illustrate the invention.

EXAMPLES

Unless otherwise stated, parts and percents are given by weight.

EXAMPLE 1

13.3 g ethylene/vinyl acetate copolymer (18% vinyl acetate, maximum tensile strength 2.9 N/mm$^2$ according to ASTM D-882), 19.8 grams cyan pigment based on copper phthalocyanine (C.I. 74160) and 0.2 g surfactant were milled in a bead mill with half of a solvent mixture of toluene, methyl ethyl ketone, and xylene (60:35:5, 333 g total). The remaining solvent was then added with vigorous stirring. The layer formulation was coated onto a 60 μm thick polypropylene foam sheet in accordance with German OS 37 06 528 so that, after drying, a 1.5 μm thick sheet was obtained with a flawless surface without thickness variations.

A color image was formed as follows: a positive, tonable, photopolymerizable layer made according to the process described in Example 1 of European Patent Application 02 43 933 was laminated, after removal of the cover sheet, onto an image receptor and exposed through a halftone cyan color separation in a vacuum copy frame with a metal halide lamp (3000 watts) with the use of a UV filter for 42 seconds at a spacing of 95 cm. After removal of the support, the transfer layer containing the toner was laminated onto the imagewise exposed layer and immediately peeled off. The transfer layer adhered only to the unexposed tacky areas, and a positive cyan image of the original was obtained with a resolution of 1% to 99% dots in the 60 lines/cm screen.

EXAMPLE 2

A 1.0 μm thick transfer layer was prepared from the following components and processed as described above in Example 1:

| | |
|---|---|
| 16.5 g | ethylene/vinyl acetate copolymer (40% vinyl acetate, maximum tensile strength 5.3 N/mm$^2$, according to ASTM D-882) |
| 8.3 g | cyan pigment based on copper phthalocyanine (C.I. 74160) |
| 8.3 g | amorphous SiO$_2$ |
| 0.2 g | surfactant |
| 333 g | solvent (toluene/methyl ethyl ketone/xylene, 60:35:5) |

A positive cyan image Of the original was obtained with a resolution of 1%–99% dots in the 60 lines/cm screen.

EXAMPLE 3

A 0.35 μm thick transfer layer was prepared from the following components and processed as described above in Example 1:

| | |
|---|---|
| 4.18 g | polystyrene (maximum tensile strength 23 N/mm$^2$ according to DIN 53455) |
| 4.13 g | cyan pigment based on copper phthalocyanine (C.I. 74160) |
| 0.5 g | surfactant |
| 83.3 g | solvent (toluene/methyl ethyl ketone/xylene, 60:35:5) |

A positive cyan image of the original was obtained with a resolution of 1%–99% dots in the 60 lines/cm screen.

EXAMPLE 4

A 0.4 μm thick transfer layer was prepared from the following components and processed as described above in Example 1:

| | |
|---|---|
| 3.34 g | polystyrene (maximum tensile strength 23 N/mm² according to DIN 53455) |
| 0.82 g | ethylene/vinyl acetate copolymer (40% vinyl acetate, maximum tensile strength 5.3 N/mm² in accordance with ASTM D-882) |
| 4.13 g | cyan pigment based on copper phthalocyanine (C.I. 74160) |
| 0.13 g | surfactant |
| 83.3 g | solvent (toluene/methyl ethyl ketone/xylene, 60:35:5) |

A positive cyan image of the original was obtained with a resolution of 1%-99% dots in the 60 lines/cm screen.

EXAMPLE 5

A 0.7 μm thick transfer layer was prepared from the following components and processed in accordance with Example 1:

| | |
|---|---|
| 4.18 g | polystyrene (maximum tensile strength 55 N/mm² according to DIN 53455) |
| 4.13 g | cyan pigment based on copper phthalocyanine (C.I. 74160) |
| 0.05 g | surfactant |
| 83.3 g | solvent (toluene/methyl ethyl ketone/xylene, 60:35:5) |

A positive cyan image of the original was obtained with a resolution of 1%-99% dots in the 60 lines/cm screen.

EXAMPLE 6

A 0.4 μm thick transfer layer was prepared from the following components and processed in accordance with Example 1:

| | |
|---|---|
| 24.8 g | polyvinyl acetate |
| 8.3 g | cyan pigment based on copper phthalocyanine (C.I. 74160) |
| 0.2 g | surfactant |
| 333 g | solvent (toluene/methyl ethyl ketone/xylene, 60:32:5) |

A positive cyan image of the original was obtained with a resolution of 1%-99% dots in the 60 lines/cm screen.

EXAMPLE 7

A 0.5 μm thick transfer layer was prepared from the following components and processed in accordance with Example 1:

| | |
|---|---|
| 4.2 g | polymethyl methacrylate (maximum tensile strength 55 N/mm², according to ASTM D-638) |
| 4.1 g | cyan pigment based on copper phthalocyanine (C.I. 74160) |
| 0.05 g | surfactant |
| 83.3 g | solvent (toluene/methyl ethyl ketone/xylene, 60:35:5) |

A positive cyan image of the original was obtained with a resolution of 1%-99% dots in the 60 lines/cm screen.

EXAMPLE 8

A 0.6 μm thick transfer layer was prepared from the following components and processed as described above in Example 1:

| | |
|---|---|
| 4.2 g | polymethyl methacrylate (maximum tensile strength 106 N/mm², according to ASTM D-638) |
| 4.1 g | cyan pigment based on copper phthalocyanine (C.I. 74160) |
| 0.1 g | surfactant |
| 83 g | solvent (toluene/methyl ethyl ketone/xylene, 60:35:5) |

A positive cyan image of the original was obtained with a resolution of 1%-99% dots in the 60 lines/cm screen.

EXAMPLE 9

A 0.4 μm thick transfer layer was prepared from the following components and processed in accordance with Example 1:

| | |
|---|---|
| 4.2 g | methyl methacrylate/butyl methacrylate copolymer (maximum tensile strength 11 N/mm², according to ASTM D-638) |
| 4.1 g | cyan pigment based on copper phthalocyanine (C.I. 74160) |
| 0.1 g | surfactant |
| 83 g | solvent (toluene/methyl ethyl ketone/xylene, 60:35:5) |

A positive cyan image of the original was obtained with a resolution of 1%-99% dots in the 60 lines/cm screen.

COMPARATIVE EXAMPLE 1

A 1.8 μm thick transfer layer was prepared from the following components and processed as described above in Example 1:

| | |
|---|---|
| 100 g | styrene/butadiene copolymer (50% aqueous suspension, 45% styrene, maximum tensile strength 0.4 N/mm², according to ASTM D-412-75 |
| 112.5 g | cyan pigment based on copper phthalocyanine (C.I. 74160) |
| 0.5 g | anionic fluorinated surfactant |
| 437 g | deionized water |

A binder as taught by the art was used to prepare the transfer layer. Satisfactory resolution was not achieved in the imagewise transfer of the pigment layer.

EXAMPLE 10

A 0.45 μm thick transfer layer was prepared from the following components and processed as described above in Example 1:

| | |
|---|---|
| 3.34 g | ethylene/vinyl acetate copolymer (40% vinyl acetate, maximum tensile strength 5.3 N/mm², according to ASTM D-882) |
| 0.83 | nitrocellulose (nitrogen content less |

| | |
|---|---|
| | than 12.6%) |
| 4.3 g | cyan pigment based on copper phthalocyanine (C.I. 74160) |
| 0.13 g | surfactant |
| 83.3 g | solvent |

A positive cyan image of the original was obtained with a resolution of 1%–99% dots in the 60 lines/cm screen.

EXAMPLE 11

The cyan, magenta, yellow and black transfer layers required to make a four-color image were prepared by milling the quantities provided in Table 1 of pigment, binder, and surfactant in a bead mill with 40–60% of the necessary total solvent mixture of toluene, methyl ethyl ketone, and xylene (6:3:1). The remaining solvent is then added with vigorous stirring.

TABLE 1

| | Cyan (g) | Magenta (g) | Yellow (g) | Black (g) |
|---|---|---|---|---|
| Pigment | 52.50 | 80 | 35.0 | 50 |
| Amorphous SiO$_2$ | 15.00 | 50 | 8.0 | 40 |
| Ethylene/vinyl acetate copolymer 18% vinyl acetate, maximum tensile strength: 5.9 N/mm$^2$, according to ASTM D-882 | 80.55 | 116.75 | 56.0 | 107.4 |
| Anionic surfactant | 1.95 | 3.25 | 1.0 | 2.6 |
| Solvent | 850.0 | 750.0 | 900.0 | 800.0 |

A mixture of a cyan pigment based on copper phthalocyanine (C.I. 74160) and a magenta pigment (C.I. Pigment Red 123) was used for the cyan transfer layer, a mixture of two magenta pigments (C.I. Pigment Red 122 and Pigment Red 123) was used for the magenta transfer layer, and the pigment C.I. Pigment Yellow 17 was used for the yellow transfer layer. The transfer layer for black contained C.I. Pigment Black 7. The layer composition was applied with an 80 lines/cm screen at a printing rate of 150 m/min in direct gravure printing onto a 60 μm thick polypropylene foam sheet in accordance with German OS 37 06 528 so that, after drying, a 1 μm thick layer was obtained with a flawless surface without thickness variations. Corona treatment of the sheet was not required to increase surface tension.

The color density of each layer is:
Cyan: 1.30
Magenta: 1.40
Yellow: 1.30
Black: 1.70

A four-color proof was prepared as follows: a positive, tonable, photopolymerizable layer was prepared according to the process described in Example 1 of European Patent Application 02 43 933. The cover sheet was removed and the photopolymerizable layer was laminated onto an image receptor and exposed through a halftone, positive cyan color separation in a vacuum copying frame with a metal halide lamp (3000 watts) with the use of an ultraviolet filter or 42 seconds at a spacing of 95 cm. After the support was removed, transfer layer (a) containing cyan pigment was laminated onto the imagewise exposed layer and immediately peeled off. The transfer layer adhered only to the unexposed tacky areas and a positive cyan image of the original was obtained.

A second layer of the positive, tonable, photopolymerizable recording material was laminated onto the cyan image and exposed like the above through the corresponding halftone magenta color separation. After the support was removed, transfer layer (b) containing magenta pigment was laminated onto the imagewise exposed layer and peeled off. The transfer layer adhered only to the unexposed tacky areas and a positive magenta image was obtained. The processing steps were repeated correspondingly for the yellow and black colors and then a protective layer was applied in the usual manner. A four-color proof of outstanding brilliance and sharpness was obtained with a resolution of 1–99% dots in the 60 lines/cm screen, representing a lifelike reproduction of the original. Dot gain in all four colors was about 19% in the middle tone region.

What is claimed is:

1. A light-insensitive transfer layer used to prepare a colored image, said layer comprising:
    (A) a support; and
    (B) a transfer layer having (i) at least one polymer with a tensile strength of at least 2 N/mm$^2$ and (ii) at least 20 percent by weight based on the dry transfer layer of at least one finely divided powder or combination of a finely divided powder and at least one dissolved dye.

* * * * *